(12) United States Patent
Fowler et al.

(10) Patent No.: US 11,686,959 B2
(45) Date of Patent: Jun. 27, 2023

(54) OPTICAL INSTRUMENT AND METHOD FOR DETERMINING A WAVELENGTH OF LIGHT GENERATED BY A LIGHT SOURCE, AND OPTICAL SYSTEM COMPRISING THE OPTICAL INSTRUMENT

(71) Applicant: ROCKLEY PHOTONICS LIMITED, Altrincham (GB)

(72) Inventors: Trevor Fowler, Los Angeles, CA (US); Richard Grote, Rancho Cucamonga, CA (US); Miguel Ángel Guillén-Torres, Los Angeles, CA (US); Caroline Lai, Sierra Madre, CA (US); Haydn Frederick Jones, London (GB)

(73) Assignee: Rockley Photonics Limited, Altrincham (GB)

( * ) Notice: Subject to any disclaimer, the term of this patent is extended or adjusted under 35 U.S.C. 154(b) by 0 days.

(21) Appl. No.: 17/832,509

(22) Filed: Jun. 3, 2022

(65) Prior Publication Data
US 2022/0373829 A1  Nov. 24, 2022

Related U.S. Application Data

(63) Continuation-in-part of application No. 17/743,427, filed on May 12, 2022, now abandoned.

(60) Provisional application No. 63/188,390, filed on May 13, 2021.

(51) Int. Cl.
*G02F 1/11* (2006.01)
*G01J 1/42* (2006.01)

(52) U.S. Cl.
CPC .............. *G02F 1/116* (2013.01); *G02F 1/113* (2013.01); *G01J 2001/4247* (2013.01)

(58) Field of Classification Search
CPC .. G02F 1/116; G02F 1/113; G01J 2001/4247; G01R 31/2635; H01S 5/0014; H01S 5/0085; H01S 5/4087
USPC ........................................................ 356/328
See application file for complete search history.

(56) References Cited

U.S. PATENT DOCUMENTS

| | | | |
|---|---|---|---|
| 2005/0157969 A1* | 7/2005 | Imajuku | G01J 9/00 385/1 |
| 2013/0169973 A1* | 7/2013 | Inoue | G01B 9/02091 356/497 |

OTHER PUBLICATIONS

Bei, L. et al., "Acousto-optic tunable filters: fundamentals and applications as applied to chemical analysis techniques", Progress in Quantum Electronics, 2003, pp. 67-87, vol. 28, Elsevier Ltd.
Chang, I. C., "Analysis of the Noncollinear Acousto-Optic Filter", Nov. 10, 1975, vol. 11, Nos. 25 and 26, pp. 617-618, Electronic Letters.

(Continued)

*Primary Examiner* — Md M Rahman
(74) *Attorney, Agent, or Firm* — Lewis Roca Rothgerber Christie LLP

(57) ABSTRACT

An optical instrument for determining a wavelength of light generated by a light source. The optical instrument may include a signal generator for generating a driving signal, a tunable optical filter device configured to receive the driving signal, the tunable optical filter device configured to diffract the light generated by the light source based on the driving signal, an optical detector device configured to detect a timing of maximum diffraction of light diffracted by the tunable optical filter device, and an analyzer configured to determine the wavelength of the light based the timing of maximum diffraction.

19 Claims, 9 Drawing Sheets

(56) References Cited

OTHER PUBLICATIONS

Chang, I. C., "Noncollinear acousto-optic filter with large angular aperture", Applied Physics Letters, Oct. 1, 1974, vol. 25, No. 7, pp. 370-372, American Institute of Physics.
Gottlieb, M. S., "Acousto-Optic Tunable Filters", Chapter 4, Design and Fabrication of Acousto-Optic Devices, 1994 pp. 197-283, Marcel Dekker, Inc.
Hao, H. et al., "Exploratory Research on Quantitative Analysis of Gaseous Mixtures by AOTF-NIR Spectrometer", Spectroscopy and Spectral Analysis, Aug. 2009, vol. 29, No. 8, pp. 2087-2091.
Harris, S. E. et al., "Acousto-Optic Tunable Filter", Journal of the Optical Society of America, Jun. 1969, pp. 744-747, vol. 59, No. 6.
Huimin, H. et al., "Extending AOTF-NIR Spectrometer to Gas Measurement", The Eighth International Conference on Electronic Measurement and Instruments, 2007, pp. 1-407 through 1-412, IEEE.
Korablev, O.I. et al., "Compact high-resolution echelle-AOTF NIR spectrometer for atmospheric measurements", International Conference on Space Optics—ICSO 2004, Mar. 30, 2004 through Apr. 2, 2004, Proc of SPIE, pp. 105680A-2 through 105680A-9, vol. 10568, ESA and CNES.
Yano, T. et al., "Acoustooptic TeO2 tunable filter using far-off-axis anisotropic Bragg diffraction", Applied Optics, Sep. 1976, pp. 2250-2258 vol. 15, No. 9.

\* cited by examiner

OPTICAL INSTRUMENT AND METHOD FOR DETERMINING A WAVELENGTH OF LIGHT GENERATED BY A LIGHT SOURCE, AND OPTICAL SYSTEM COMPRISING THE OPTICAL INSTRUMENT

CROSS-REFERENCE TO RELATED APPLICATION(S)

The present application is a continuation-in-part of U.S. patent application Ser. No. 17/743,427, filed May 12, 2022, entitled "OPTICAL INSTRUMENT AND METHOD FOR DETERMINING A WAVELENGTH OF LIGHT GENERATED BY A LIGHT SOURCE, AND OPTICAL SYSTEM COMPRISING THE OPTICAL INSTRUMENT", which claims priority to and the benefit of U.S. Provisional Application No. 63/188,390, filed May 13, 2021, entitled "HIGH SPEED, ACOUSTO-OPTIC LASER FREQUENCY DISCRIMINATOR"; the entire contents of all of the documents identified in this paragraph are incorporated herein by reference.

FIELD

Some embodiments of the invention relate to an optical instrument for determining a wavelength of light generated by a light source, comprising a tunable optical filter device configured to receive the driving acoustic signal, wherein the tunable optical filter device is configured to filter the light generated by the light source by diffracting light of a particular optical frequency. Some embodiments of the invention further relate to an optical system, comprising the optical instrument and a light source generating light which is input into the tunable optical filter device. Some embodiments of the invention also relate to a method for determining a wavelength of light generated by a light source, comprising the step of filtering the light generated by the light source by means of diffraction of light.

BACKGROUND

Determining the wavelength of a laser is one of the most critical experiments required for initial or regular device validation. Lasers are required to have stable output over both short and long time periods in both wavelength and intensity for many applications. Characterizing these properties is even more critical and difficult when a laser is operating in a pulsed mode, where the laser is turned on and off with a known period and duty cycle. This is due to the complex interplay between the quantum mechanics determining the generation of light via stimulated emission and the thermal dynamics of the substrate. Since these lasers are often switched on for relatively short periods of time (typically in the microsecond regime), it becomes critical to make extremely fast wavelength measurement to determine dynamics and settling time of such a device.

SUMMARY

Accordingly, some embodiments of the present invention aim to solve the above problems by the subject matter of the independent claims. The dependent claims describe optional embodiments of the invention.

Some embodiments of the invention described herein refer to an optical instrument and/or a method for making accurate wavelength measurements over very short time scales using acousto-optic tunable filters (AOTFs). These devices can utilize specialized birefringent crystals such as lithium niobate or tellurium dioxide which, when excited by an RF signal, establish refractive index patterns that act as diffraction gratings for light of specific polarization orientation and optical frequency (wavelength), filtering out and allowing to track the optical frequency of a device under test (DUT) such as a laser or an apparatus including a laser.

Some embodiments of the invention allow for the determination of wavelength (optical frequency) over extremely large wavelength ranges (in this case, between 1400-2400 nm, but can be expanded by using different acousto-optic tunable filters).

Some embodiments of the invention allow for the determination of optical frequency at high rates (~25-50 microsecond resolution).

Some embodiments of the invention allow these measurements to be interpolated with a pulsed DUT (improving time resolution to 5-10 microseconds).

Filter linewidth can be improved by double-passing the optical path through the AOTF as described herein.

Filter linewidth can be improved by using multiple AOTFs as described herein.

A first aspect of this disclosure relates to an optical instrument for determining a wavelength of light generated by a light source, comprising a signal generator for generating a driving signal, a tunable optical filter device optionally including an acousto-optic tunable filter (AOTF) configured to receive the driving signal, the tunable optical filter device configured to filter the light generated by the light source based on the diffraction of light of a particular frequency that depends on the (acoustic) frequency of the driving signal, an optical detector device configured to detect the intensity of light diffracted by the tunable optical filter device as a function of time, and an analyzer configured to determine the wavelength of the light based on the timing of the maximum intensity of the diffracted optical signal or the minimum intensity of the undiffracted optical signal.

A second aspect of this disclosure relates to an optical system, comprising the optical instrument, and a light source generating light which is input into tunable optical filter device.

A third aspect of this disclosure relates to a method for determining a wavelength of light generated by a light source, comprising the steps of a) generating a driving signal, b) filtering the light generated by the light source based on the driving signal, c) detecting the intensity of the filtered light as a function of time, and d) determining the wavelength of the light based on the correlation in time between the acoustic frequency of the driving signal and the intensity of the filtered optical signal.

Aspects of some embodiments of the invention can be summarized as follows:
  Method for the determination of the instantaneous wavelength of a light source
    Using AOTF-based acoustic frequency scans.
  Optical instrument used to determine the instantaneous wavelength of a light source
    Using acoustic frequency scans on the signal driving the AOTF and/or
    Utilizing time delays to improve time resolution of frequency measurements.
  Optical instrument to determine the wavelength of a light source over a large bandwidth
    Using AOTF based acoustic frequency scans and/or
    Utilizing AOTF double-pass geometry to improve optical filter performance and/or Utilizing multiple AOTFs to improve optical filter performance and/or increase the optical frequency range of operation.

The light source may be the DUT which can include an output port through which the (laser) light generated by the laser of the light source exits the light source. Alternatively, the light source can be opened to access the output port or the light itself. The optical instrument or an acousto-optic tunable filter device thereof (which is an example of the tunable optical filter device) is configured to be coupled to the output port or to be put in the light within the light source so that the light impinges on the acousto-optic tunable filter device. For example, the optical instrument may include light guiding means such as an optical fibre and/or mirrors for conveying the light generated by the light source from the output port to the acousto-optic tunable filter device.

The light source may be configured to generate light of a fixed wavelength, in particular a wavelength which is constant over time. The light source may include one or more lasers and/or one or more light emitting diodes (LED). The light generated by these devices exits the light source at the output port.

Further optional features of the invention are set out below.

The optical instrument and the method may be used to determine the wavelength of the light generated by the light source and/or whether the wavelength of the light generated by the light source is constant or varying over time. To this end, the measurements executed by the optical instrument or the method can be repeatedly executed to determine a time behavior of the wavelength of the light generated by the light source. The optical instrument may be considered as a test or validation instrument for the light source.

The optical instrument may include a housing and/or an input port which is configured to couple in the light generated by the light source. The input port may be coupled to the output port of the light source by means of a light conveying device, such as a waveguide, a mirror and/or an optical fibre, or it may be input in free space by means of a lens system or collimator. The input port may include a transparent window and/or a cavity in the housing through which the light generated by the light source can propagate. The optical instrument may include means for conveying the light from the input port to the acousto-optic tunable filter device, such as a waveguide, a mirror, and/or an optical fibre. Alternatively or additionally, there is a free space between input port and the acousto-optic tunable filter device such that light that enters the optical instrument via the input port can impinge on the acousto-optic tunable filter device. In general, the optical instrument allows the propagation of light from the input port to acousto-optic tunable filter device. This means that the light generated by the light source can impinge on the acousto-optic tunable filter device.

The acousto-optic tunable filter device is electrically and/or electronically coupled or connected to the signal generator and is configured to receive the driving signal that is generated by the signal generator. The acousto-optic tunable filter device is configured to filter light of a particular optical frequency (wavelength) impinging on the acousto-optic tunable filter device based on or according to the (acoustic) frequency of the driving signal. This means, a degree of diffraction provided by the acousto-optic tunable filter device depends on the (acoustic) frequency of the driving signal and the optical frequency of the light traversing it. A variation of the acoustic frequency of the driving signal results in a variation of the value of the optical frequency of the light diffracted (filtered) by the acousto-optic tunable filter device. In general, a change in the driving signal results in a change of a parameter (such as the optical frequency) of the light diffracted (filtered) by the acousto-optic tunable filter device.

The acousto-optic tunable filter device is an electro-optic component that is capable of discriminating the light going through the device based on its frequency (wavelength) and diffracting light of a specific wavelength that depends on the (acoustic) frequency of the driving signal, while leaving light of other optical frequencies pass through the optical filter device undiffracted.

The optical instrument may include optical means for conveying the light diffracted (filtered) by the tunable optical filter device to the optical detector device. For example, a lens or lens system may be used to collect the diffracted or the undiffracted light exiting the acousto-optic tunable filter into free space and focus it on an optical detector device. Alternatively or additionally, mirrors or other optical components for directing the light that is either diffracted or left undiffracted by the tunable optical filter to the optical detector device can be provided. Due to Signal-to-Noise Ratio (SNR) considerations, the first order diffraction is usually chosen to be measured.

The optical detector device may be comprised of elements such as photodiodes for detecting the first-order diffracted light and/or the zeroth-order diffracted light (undiffracted light), and an analog-to-digital converter (ADC) to measure the intensity of the signal in time. The optical detector device, in particular the analog-to-digital converter, may include an analyzer or performs the functions of the analyzer. The signals input into the analog-to-digital converter from the photodiodes can be considered inputs to the analyzer. The analyzer may be connected or coupled to the optical detector device, in particular the analog-to-digital converter.

The analyzer can be electronically or electrically connected or coupled to the optical detector device for receiving the electronic or electric signal that is generated by the optical detector device. The analyzer may include one or more processing means, the analog-to-digital converter, a memory, a computer, and/or other electrical or electronic components for analyzing the received electronic or electrical signals. For example, the analyzer may store and execute an algorithm and/or program for analyzing the received electronic or electrical signal. This algorithm and/or program is configured to extract the wavelength of the light filtered by the acousto-optic tunable filter device from the electronic or electric signal generated by an optical detector device based on the light received from the acousto-optic tunable filter device.

The signal generator may be a means for generating an electric or electronic signal at acoustic frequencies. The signal generator is electrically or electronically connected or coupled to the acousto-optic tunable filter device and/or to the analyzer. The driving signal may be any electronic or electric signal that drives the acousto-optic tunable filter device and results in a periodic change in the index of refraction of the birefringent crystal inside the acousto-optic tunable filter device, which diffracts light of a particular wavelength. The signal generator may generate a base signal (such as a wave having a constant frequency). A parameter of the base signal, e.g., its frequency, is changed by the signal generator. Both the base signal and the change in the parameter provide the AOTF driving signal.

The acousto-optic tunable filter uses the acousto-optic effect to diffract light using sound waves. The frequency, phase, and/or amplitude of the sound waves can be set by the driving signal. For example, the driving signal is directly converted into the sound waves by a transducer in the tunable optical filter device. The change in the diffraction based on the driving signal may result in a change of the direction of the diffracted light and/or the amplitude/intensity of the diffracted light at a given position on the optical detector device.

In an optional embodiment, the signal generator generates the driving signal which includes a sweep of a parameter of the driving signal for determining the wavelength of the light, wherein the degree of diffraction efficiency by the AOTF device is highest if the optical and acoustic frequencies match the Bragg diffraction criterion and the momentum of the diffracted beam is matched by the sum of the momenta of the incident beam and the acoustic wave.

In an optional embodiment, the signal generator generates the driving signal which is a frequency-modulated wave whose frequency is swept from a minimum frequency to a maximum frequency. Further optionally, depending on the particular AOTF material and configuration, a frequency of the sweep can be between 50 MHz to 200 MHz The change in the frequency results in a change of the acoustic wave generated by the transducer in the acousto-optic tunable filter. The acoustic wave establishes periodic regions of lattice compression and rarefaction throughout the AOTF crystal that are manifested as periodic refractive index fluctuations which creates a diffraction grating. A change in the frequency of the acoustic wave induced by the frequency sweep results in a change in the periodicity of the diffraction grating. As a result, the wavelength of the diffracted light changes. This change can be detected by monitoring the amplitude of the diffracted light at a certain location over time and correlating the time of the occurrence of the maximum diffraction to the (inferred) acoustic frequency at that time, based on the frequency sweep range and duration. After determining the acoustic frequency at the time of maximum diffraction efficiency, it is possible to determine the optical frequency, based on a calibration curve between the peak of the filter function and the optical frequency, previously obtained by sweeping the (known) wavelength of a tunable light source and measuring the timing of the maximum diffraction with the same acoustic frequency sweep conditions. Thus, a sweep of the frequency results in a change in the amplitude of the modulated light at a certain location at a certain time.

The signal generator optionally includes an arbitrary waveform generator. The arbitrary waveform generator is configured to generate a wave whose frequency can be swept (continuously changed) between a minimal frequency and a maximal frequency.

The signal generator is optionally configured to generate a trigger signal simultaneous to the generation of the driving signal for indicating a start of the driving signal frequency sweep. The trigger signal may be a pulse that is generated when the sweep of the frequency is started. In other words, the pulse is emitted at the same time as the start of the sweep of the frequency. Alternatively, the trigger signal may be generated as long as the frequency is swept so that a start of the trigger signal coincides with the start of the sweep of the frequency and the end of trigger signal coincides with the end of the sweep of the frequency. For example, the start of the trigger signal coincides with the generation of the minimal frequency and the end of the trigger signal coincides with the generation of the maximal frequency of the sweep of frequencies.

In an optional embodiment, the signal generator is configured to be coupled to the light source, wherein the signal generator is configured to supply the trigger signal to the light source for starting the generation of a light pulse.

For example, the signal generator may include a first signal port to which a cable or wire can be connected which in turn is connected to the light source. In this way, the trigger signal can be used to start the generation of light by the light source. For example, if the trigger signal is a pulse, the light source starts the generation of flight when receiving the trigger signal.

The signal generator is optionally coupled to the analyzer for supplying the trigger signal to the analyzer. For example, the signal generator may include a second signal port to which a cable or wire can be connected which in turn is connected to the analyzer. This allows the analyzer to detect when the driving signal frequency sweep is started.

The analyzer includes a calibration means configured to determine the value of the parameter based on the trigger signal. For example, the calibration means is configured to store a relationship between the wavelength of a light and the time of appearance of the peak of the AOTF filter function since the generation of the trigger signal. Optionally, the calibration means includes a memory storing the relationship, wherein further optionally the relationship is a linear function.

The calibration means can be a functional unit of the analyzer. For example, the calibration means can be a separate algorithm and/or program that can be executed and stored by the analyzer. The calibration means is provided for calibrating the relationship between the wavelength of a light (that may be generated by a calibrated laser source different to the light source or DUT) and the time of appearance of the peak of the AOTF filter function since the start of the frequency sweep of the driving signal. Thus, the calibration means allows the analyzer to identify the wavelength of the light source solely based on the time elapsed since the start of the generation of the frequency sweep of the driving signal.

For example, the calibration means stores various time delays with respect to the onset of the frequency sweep of the driving signal, corresponding to the appearance of the maximum intensity of the AOTF filter function for light having a known wavelength. The delay-to-wavelength relationship may be stored as a table or a mathematical function. There may be a linear dependency between the wavelength value and the time of appearance of the maximum intensity of the AOTF filter function since the start of the frequency sweep of the driving signal. To this end, the trigger signal can be used to exactly determine the start of the driving signal frequency sweep. This relationship may then be used to determine the wavelength in that it is firstly determined when the maximum value of diffraction was recorded since the start of the driving signal frequency sweep and, secondly, the relationship is used to determine the wavelength based on this determined period of time. The relationship may be interpolated.

In other words, the calibration means can be configured to store a relationship linking the amplitude/intensity of the light and, therefore, the wavelength of the light to the time that has elapsed since the start of the sweep, i.e., since receiving the trigger signal. In this embodiment, a continuous sweep (i.e., continuous change in the frequency of the driving wave) is assumed. Based on this assumption, the frequency of the sweep is not determined during the measurement. Rather, the intensity of the diffracted light is linked to the time elapsed since the sweep start, which corresponds to a frequency of the driving wave and an optical wavelength.

The relationship may include a delay time between the generation of the trigger signal and the actual start of the sweep. This delay may be caused by the response time of the tunable optical filter device. Assuming a linear relationship, the delay can be regarded as a shift of the linear curve along the temporal or frequency axis.

In an optional embodiment, the optical detector device includes a first photodiode which is positioned to detect first-order diffracted light. Optionally, the first photodiode is configured to measure an intensity of the first-order diffracted light and to supply the measured intensity to the analyzer.

A photodiode can be a semiconductor p-n junction device that converts light into an electrical current. The current is generated when photons are absorbed in the photodiode. Thus, a maximum of the current corresponds to a maximum of first-order diffracted light. The timing of this maximum of diffracted light with respect to the frequency sweep start can be used to determine the wavelength of the light generated by the light source using the relationship stored in the calibration means.

Photodiodes usually have a small detector area so that the current or signal generated by the photodiode strongly varies depending on the degree of diffraction of the modulated light. This allows to precisely detect changes in the diffraction of the diffracted light. The photodiode thus detects the intensity of diffracted light at a particular angle. Variations of the intensity of the diffracted light at this particular angle can be reliably and precisely detected. For example, the first photodiode is located at a position within an angular range that corresponds to the angles of the first-order diffracted light which are generated by the frequency sweep.

The first photodiode or the optical detector device is fixed with respect to the tunable optical filter device. The position of the first photodiode within the angular range defines the location of the maximum intensity that corresponds to a particular wavelength. In other words, the position of the first photodiode defines the above-described relationship which can be determined by calibration. For example, a light source having a known and fixed wavelength is used to determine the relationship that can be stored in the calibration means.

Alternatively or additionally, the optical detector device includes a second photodiode which is positioned to detect zeroth-order diffracted light. Optionally, the second photodiode is configured to measure an intensity of the zeroth-order diffracted light and to supply an inverse of the measured intensity to the analyzer.

The second photodiode may be provided instead of the first photodiode. In this case the lack of intensity or minimal intensity of the modulated light is used to determine the wavelength. However, the first photodiode and the second photodiode may be simultaneously provided so that two measurements providing the same information are used. This increases the reliability and accuracy of the determination of the wavelength. The second photodiode may have the same characteristics and features as the first photodiode.

The optical detector device optionally includes an analog-to-digital converter.

The analog-to-digital converter (ADC) may be a device that converts an analog signal, such as the current or voltage generated by the optical detector device, into a digital signal which can be supplied or forwarded to the analyzer. The analog-to-digital converter may convert an analog input voltage or current corresponding to the intensity of the light impinging onto the optical detector device to a digital number representing the magnitude of the voltage or current. The analyzer is configured to process the digital signal generated by the analog-to-digital converter.

In an optional embodiment, the optical instrument further comprises a beam splitter and an optical detector configured to measure an intensity of received light and to supply the measured intensity to the analyzer, wherein the beam splitter is configured to split incoming light into a first path directed to the tunable optical filter device and a second path directed to the optical detector.

The optical detector may include one or more photodiodes and/or an optical sensor which are configured to measure the intensity of the light that impinges on the tunable optical filter device. To this end, a beam splitter or any other optical means for diverting or channeling off a beam of light is provided. This optical means is configured to re-direct an amount of light impinging onto the tunable optical filter device towards the optical detector. In other words, the beam splitter splits incoming light into the first path and the second path. The intensity of the light in the second path is significantly lower (for example 5%, 10%, or 20%) compared to the intensity of light in the first path. Further, the intensity of the light in the first path is directly proportional to the intensity of light in the second path so that measuring the intensity of the light in the second path is indicative of the intensity of light in the first path. The optical detector is used to determine the intensity of the light that impinges on the tunable optical filter device. This information may be used for calibrating the optical detector device and/or monitoring changes in the intensity of the light generated by the light source. The optical detector may be electrically or electronically connected or coupled to the analog-to-digital converter and/or to the analyzer (e.g., via the analog-to-digital converter).

The second path may include optical components for redirecting, conveying and/or transmitting the light from the beam splitter to photodetector, such as mirrors, lenses and the like.

In an optional embodiment, the signal generator generates a plurality of identical driving signals one after another for measuring the wavelength of the light at various points of time.

The plurality of identical driving signals one after another can be considered a saw-tooth signal. This means that the parameter of frequency of the driving signal is repeatedly or periodically increased from a minimum value of the parameter to a maximal value of the parameter, i.e., after reaching the maximum value, the frequency of the driving signal jumps back to the minimal value. The duration of the pulse of light generated by the light source is optionally longer than 2 or more of the sweeps, i.e., the period of change of the driving signal frequency from the minimal value to maximal value. Each sweep can be used to measure the wavelength of the light source so that, with this embodiment, the wavelength of the light source can be determined at various points of time (e.g., several times during a pulse of the light source). If identical sweeps are used (e.g., a sawtooth profile), the wavelength of the light source can be determined at equally spaced apart windows of time with respect to the start of the light pulse.

It is possible to correlate the sweep of the driving signal frequency to the pulse duration of the light source. For example, each sweep of the driving signal frequency may have approximately the same length as the pulse duration of the light source. Further, as outlined above, a plurality of sweeps of the driving signal frequency can be executed during one pulse of the light source.

In an optional embodiment, the signal generator generates the driving signal frequency sweep after the generation of the trigger signal by a predetermined time lag for varying the point in time at which the wavelength of the light is determined.

In this embodiment, the calibration means may be configured to calibrate the measurements for each predetermined time lag. Changing the time lag provides a measurement of the wavelength of the light source at different points of time. Repeating the measurements with the above-described sawtooth profile at various time lags can provide wavelength measurements over the pulse of the light source between the periodicity defined by the duration of the sweeps.

In an optional embodiment, the signal generator generates the driving signal frequency sweep and a trigger signal at the beginning of each frequency sweep, after the generation of the main trigger signal for the light source, with a predetermined time lag for varying the point in time at which the wavelength of the light is determined.

In this embodiment, the calibration means may be configured to calibrate the measurements with respect to the timing of the frequency sweep trigger signal. Repeating the measurements with the above-described sawtooth profile at various time lags can provide wavelength measurements over the pulse of the light source between the periodicity defined by the duration of the sweeps.

In an optional embodiment, the signal generator generates a plurality of identical driving signals one after another for measuring the wavelengths of the light source at various points of time, wherein the signal generator generates a first driving signal of the plurality of driving signals after the generation of the trigger signal by a predetermined time lag.

This embodiment refers to the measurement of different wavelengths; the light source may include various lasers or LEDs having different wavelengths. In this case, the time lag can be used to trigger different lasers or LEDs at different points in time and identify the different wavelengths in the analysis of the sweeps of the subsequent driving signals. In other words, the different time lags make it possible to separate or identify the intensity peaks coming from different lasers or LEDs and determine the wavelength of each laser and/or LED of the light source. The time lag is in this case thus a time code with which lasers and/or LEDs of the light source are measured.

In an optional embodiment, the optical instrument further comprises a diffraction device configured to diffract light depending on its wavelength, wherein the diffraction device is positioned to diffract the light previously diffracted by the tunable optical filter device.

The diffraction device is positioned in the light path between the tunable optical filter device and the optical detector device. The diffraction device is configured to divert light differently depending on the wavelength, i.e., the angle of diffraction changes depending on the wavelength. This may result in a spatial separation of the light diffracted by the tunable optical filter device which then impinges on the optical detector device. In other words, the optical detector device may be configured to detect the light diffracted by the tunable optical filter device at spatially separated locations. For example, the optical detector device may include a plurality of photodiodes each of which is spatially separated from each other and corresponds to a respective wavelength. Alternatively, the optical detector device may include a camera whereby the diffraction device provides a spatial resolution of the different wavelengths. Thus, the diffraction device allows to simultaneously measure light from the light source having different wavelengths.

In an optional embodiment, the diffraction device is positioned to diffract the first-order diffracted light. Further optionally, the diffraction device is a diffraction grating.

In an optional embodiment, the light source includes a laser and/or a light emitting diode (LED), wherein optionally the light source is configured to be run in continuous or pulsed operation.

In an optional embodiment, the light source includes a power driver configured to output a drive current to the laser and/or a light emitting diode (LED), the drive current controlling the output of the light.

In an optional embodiment of the method, the light is diffracted by a tunable optical filter device, optionally by an acousto-optic tunable filter (AOTF).

In an optional embodiment of the method, the light is diffracted based on the driving signal.

In an optional embodiment of the method, the driving signal includes a sweep of a parameter of the driving signal for determining the wavelength of the light, wherein the degree of diffraction is highest if the wavelength of the light corresponds to a particular value of the parameter of the driving signal.

In an optional embodiment of the method, the driving signal is a frequency-modulated wave whose frequency is swept from a minimum frequency to a maximum frequency.

In an optional embodiment of the method, a nominal frequency of the sweep is between 50 MHz to 200 MHz.

In an optional embodiment of the method, the driving signal is generated by an arbitrary waveform generator.

In an optional embodiment of the method, the method further comprises a step of generating a trigger signal simultaneous to the generation of the driving signal parameter sweep for indicating a start of the driving signal parameter sweep.

In an optional embodiment of the method, a light source trigger signal is supplied to the light source for starting the generation of a light pulse.

In an optional embodiment of the method, the method further comprises a step of storing a relationship between the wavelength of a light and the time since the generation of the trigger signal parameter sweep.

In an optional embodiment of the method, the relationship is a linear function.

In an optional embodiment of the method, the method further comprises determining the wavelength of the light generated by the light source using the relationship.

In an optional embodiment of the method, the step of detecting the timing of maximum diffraction of the diffracted light includes detecting first-order diffracted light.

In an optional embodiment of the method, the step of detecting the timing of maximum diffraction of the diffracted light includes measuring an intensity of the first-order diffracted light, wherein the step of determining the wavelength is based on the measured intensity over time of the first-order diffracted light.

In an optional embodiment of the method, the step of detecting the timing of maximum diffraction of the diffracted light includes detecting zeroth-order diffracted light.

In an optional embodiment of the method, the step of detecting the timing of maximum diffraction of the diffracted light includes measuring an intensity of the zeroth-order diffracted light, wherein the step of determining the wavelength is based on the timing of an inverse of the measured intensity of the zeroth-order diffracted light.

In an optional embodiment of the method, the step of detecting the timing of maximum diffraction of the modulated light includes using an analog-to-digital converter.

In an optional embodiment of the method, the method further comprises a step of splitting light coming from the light source into a first path which is diffracted based on the generated driving signal and a second path, wherein an intensity of the light of the second path is measured.

In an optional embodiment of the method, the intensity of light of the second path is measured by a photodiode.

In an optional embodiment of the method, a plurality of identical driving signals is generated one after another for measuring the wavelength of the light at various points of time.

In an optional embodiment of the method, the driving signal is generated after the generation of the light source trigger signal by a predetermined time lag for varying the point in time at which the wavelength of the light is determined.

In an optional embodiment of the method, a plurality of identical driving signals is generated one after another for measuring the wavelengths of the light source at various points of time, wherein a first driving signal of the plurality of driving signals is generated after the generation of the light source trigger signal by a predetermined time lag.

In an optional embodiment of the method, the method further comprises a step of additionally diffracting the diffracted light depending on its wavelength.

In an optional embodiment of the method, the zeroth-order diffracted light and/or the first-order diffracted light is additionally diffracted.

BRIEF DESCRIPTION OF THE DRAWINGS

Embodiments of the invention will now be described by way of example with reference to the accompanying drawings in which.

DETAILED DESCRIPTION

The detailed description set forth below in connection with the appended drawings is intended as a description of exemplary embodiments of an optical instrument provided in accordance with the present invention and is not intended to represent the only forms in which the present invention may be constructed or utilized.

Figure 1:
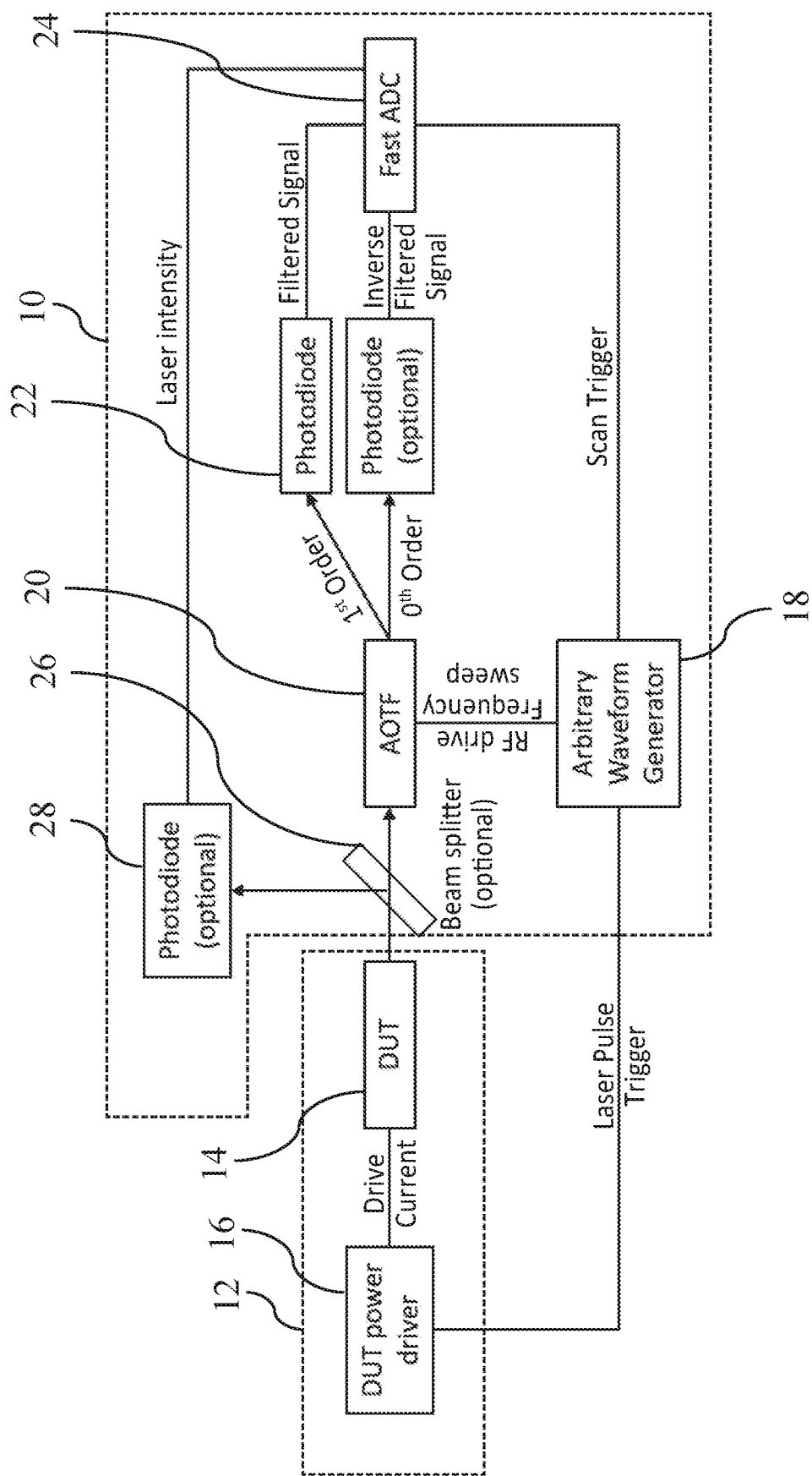
FIG. 1 is a is a block diagram of a light source and an optical instrument for determining a wavelength of the light source.

The present optical instrument 10 shown in FIG. 1 can be used to determine a wavelength of a light generated by light source 12. For example, the optical instrument 10 can be used to validate the correct functioning of the light source 12. The light source 12 includes a laser or LED 14, which can be a device-under-test (DUT), and a power driver 16. The power driver 16 generates a drive current for powering and controlling the laser or LED 14. The power driver 16 generates a drive current immediately after receiving a trigger signal from a signal generator 18.

The optical instrument 10 further includes a signal generator 18, a tunable optical filter device 20, an analyzer 24, a beam splitter 26, and/or an optical detector 28. The tunable optical filter device 20 may include an acousto-optic tunable filter (AOTF) and is positioned to receive the light generated by the laser 14. The tunable optical filter device 20 is electrically or electronically connected to the signal generator 18. The tunable optical filter device 20 is configured to diffract impinging light depending on a driving signal received from the signal generator 18. In other words, the signal generator 18 generates the driving signal based on which the light is diffracted by the tunable optical filter device 20. For example, if a parameter of the driving signal is a particular value, the intensity of the diffracted light is highest resulting, for example, in a maximum in the first order diffraction. This can be detected by optical detector device 22 which includes one or more photodiodes. For example, a first photodiode is configured to detect the intensity of the first-order diffracted light and a second photodiode is configured to detect the intensity of the zeroth-order. A maximum in the intensity detected by the first photodiode and a minimum in the intensity detected by the second photodiode indicate that the current parameter of the driving signal corresponds to the wavelength generated by the light source 12.

Figure 2:
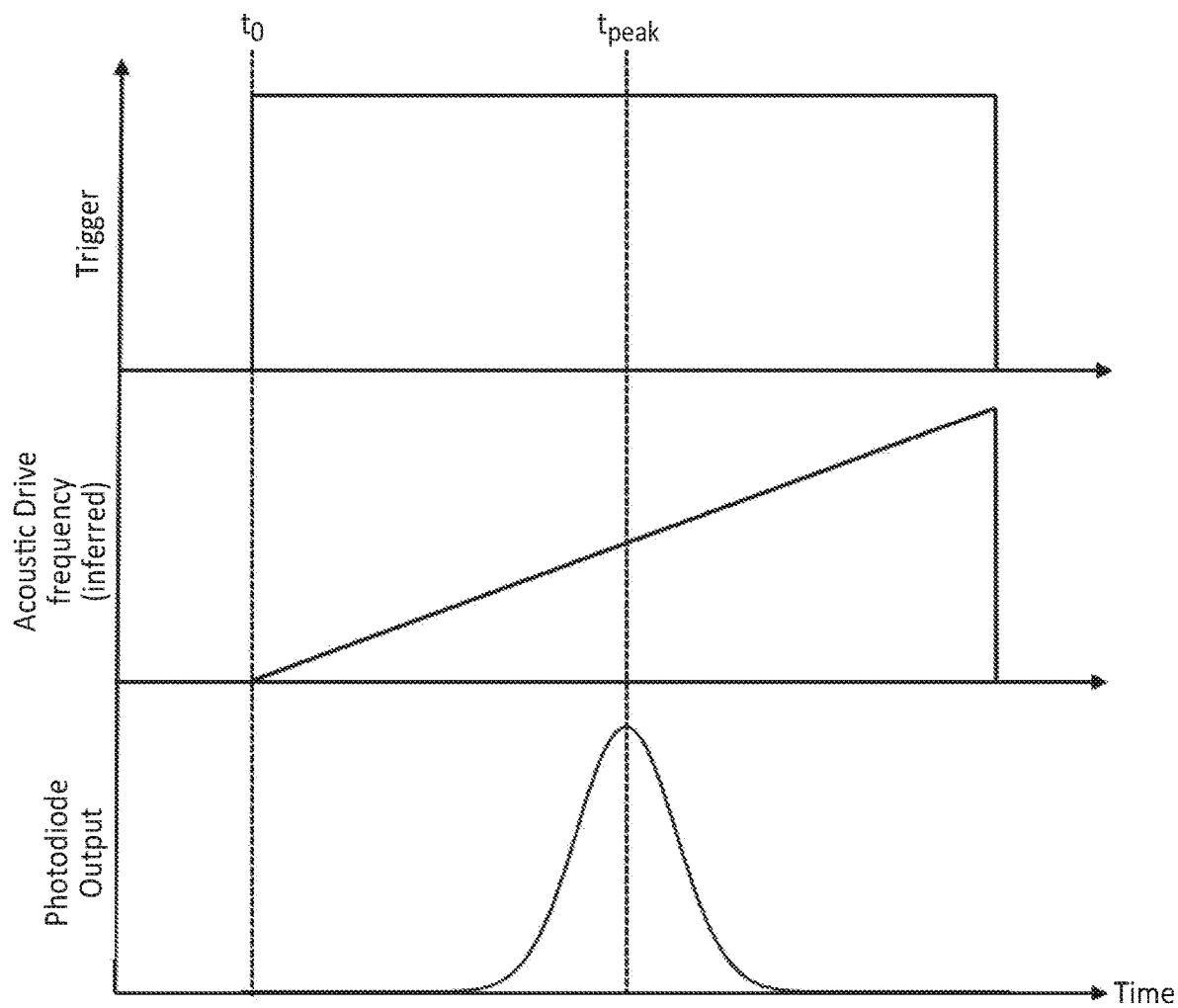
FIG. 2 shows time evolutions of a trigger signal, a parameter of a driving signal, and a measured intensity as observed when operating the optical instrument of FIG. 1.

The signal generator 18 continuously varies the parameter of the driving signal which may be the frequency of a wave as long as the light source 12 generates light (see FIG. 2). For example, the signal generator 18 generates a sweep of the frequency from a minimum frequency to a maximum frequency (see middle graph of FIG. 2). This sweep of the frequency results in a change of detected intensity which reaches a maximum at the first photodiode (see lower graph of FIG. 2) and a corresponding minimum at the second photodiode at a certain point in time.

The signal generator 18 generates a trigger signal which is forwarded to the analyzer 24. The time since the receipt of the trigger signal which also starts to sweep of the driving signal can be used to determine the current value of the driving signal parameter such as the current frequency of the acoustic wave generated by the tunable optical filter device 24 for diffracting the light generated by the light source 12. If the time that has passed since the receipt of the trigger signal is stored in relation to known acoustic frequencies and corresponding wavelengths during a calibration (see FIG. 3), this relationship can be used to determine the wavelength of the light source 12. To this end, the analyzer 24 determines when the intensity of the signal generated by the first photodiode is maximal and/or the intensity of the signal generated by the second photodiode is minimal. The relationship is then used to determine the wavelength based on this point of time.

Figure 4:
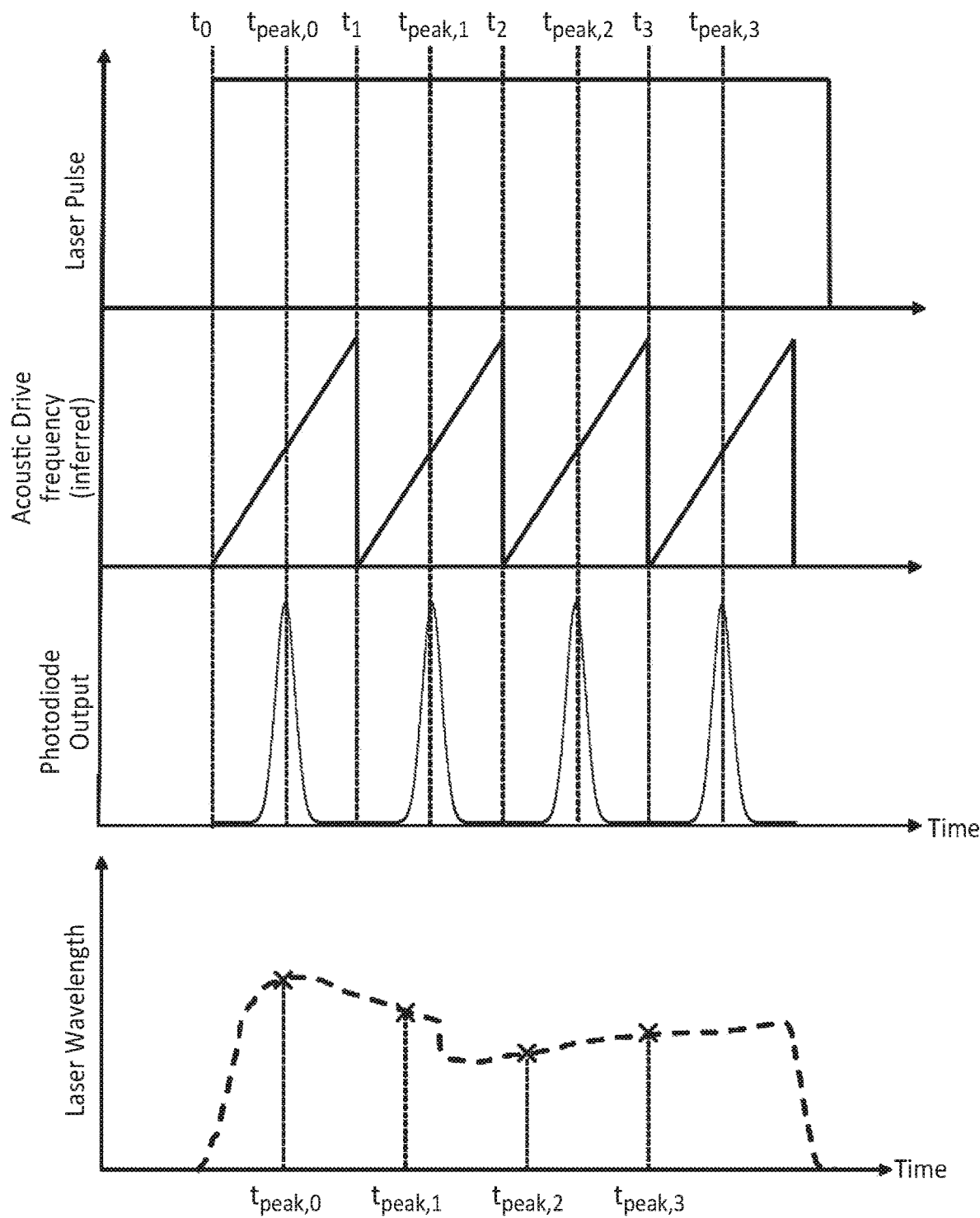
FIG. 4 shows time evolutions of a laser pulse, a parameter of a driving signal, a measured intensity as observed when operating the optical instrument of FIG. 1 according to a second embodiment, and the corresponding measurements of wavelength over time.

In a different embodiment, the signal generator 18 may be configured to repeatedly generate a sweep of the parameter of the driving signal resulting in a saw-tooth profile of the parameter of the driving signal (see second graph in FIG. 4). In this way, the wavelength can be determined at various points of time during the generation of light by the light source 12. This allows an observation of a temporal behavior of the wavelength (see bottom graph of FIG. 4).

Figure 5:
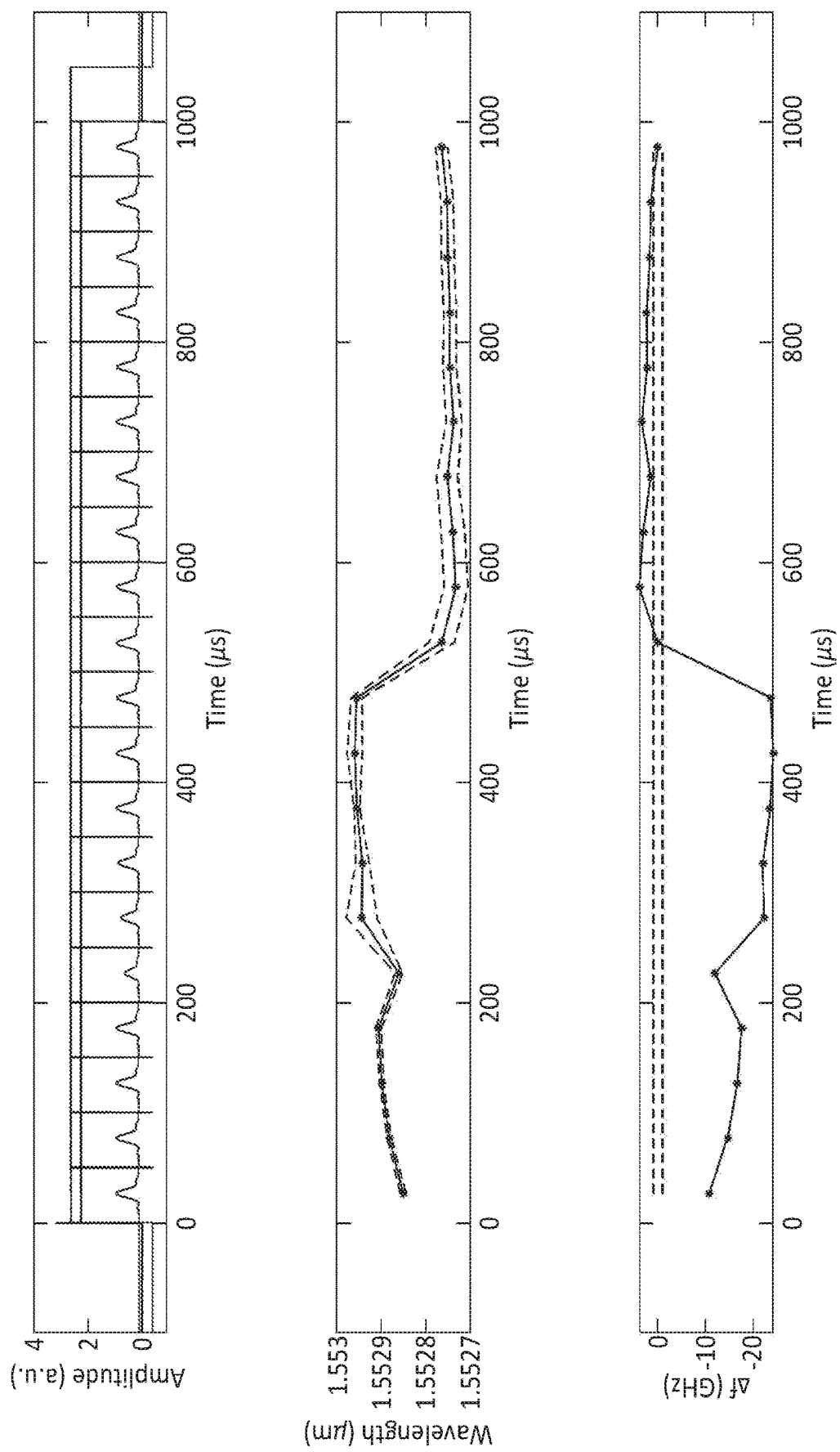
FIG. 5 shows the measured intensity over time of the measurement according to FIG. 4, the average measured wavelength over time of the measurement according to FIG. 4 for multiple optical pulses, and the corresponding deviation from the steady state optical frequency over time.

FIG. 5 shows an actual measurement result, whereby the average delay of 100 optical signal peaks obtained for 100 laser pulses (upper graph) is translated to an average wavelength value and its 95% confidence interval for each frequency sweep window (middle graph). The deviation from the steady state optical frequency along with arbitrary tolerance bands is shown in the lower graph.

The temporal distance between the point of time when wavelength can be determined (i.e. the periodicity of the measurement) depending on the duration of the sweep which can be determined by external factors such as the rise time of the tunable optical filter device 20. In order to provide wavelength measurements between those points of time, the start of the first sweep of subsequent sweep trains may be delayed by a predetermined delay time (see FIG. 6). By varying the delay time and repeating the measurement of FIG. 4 in the fashion shown in FIG. 6, more measurements of the wavelength over the same time range can be achieved (see bottom graph of FIG. 6).

The beam splitter 26 splits the light generated by light source 12 into a first path which leads to the optical tunable optical filter device 20 and a second part which leads to the optical detector 28. The optical detector 28 includes a photodiode and is configured to measure the intensity of the light generated by the light source 12. The optical detector 28 is electrically connected to the analyzer 24. This allows to measure the intensity of the light generated by the light source and address potential changes in the intensity.

Figure 3:
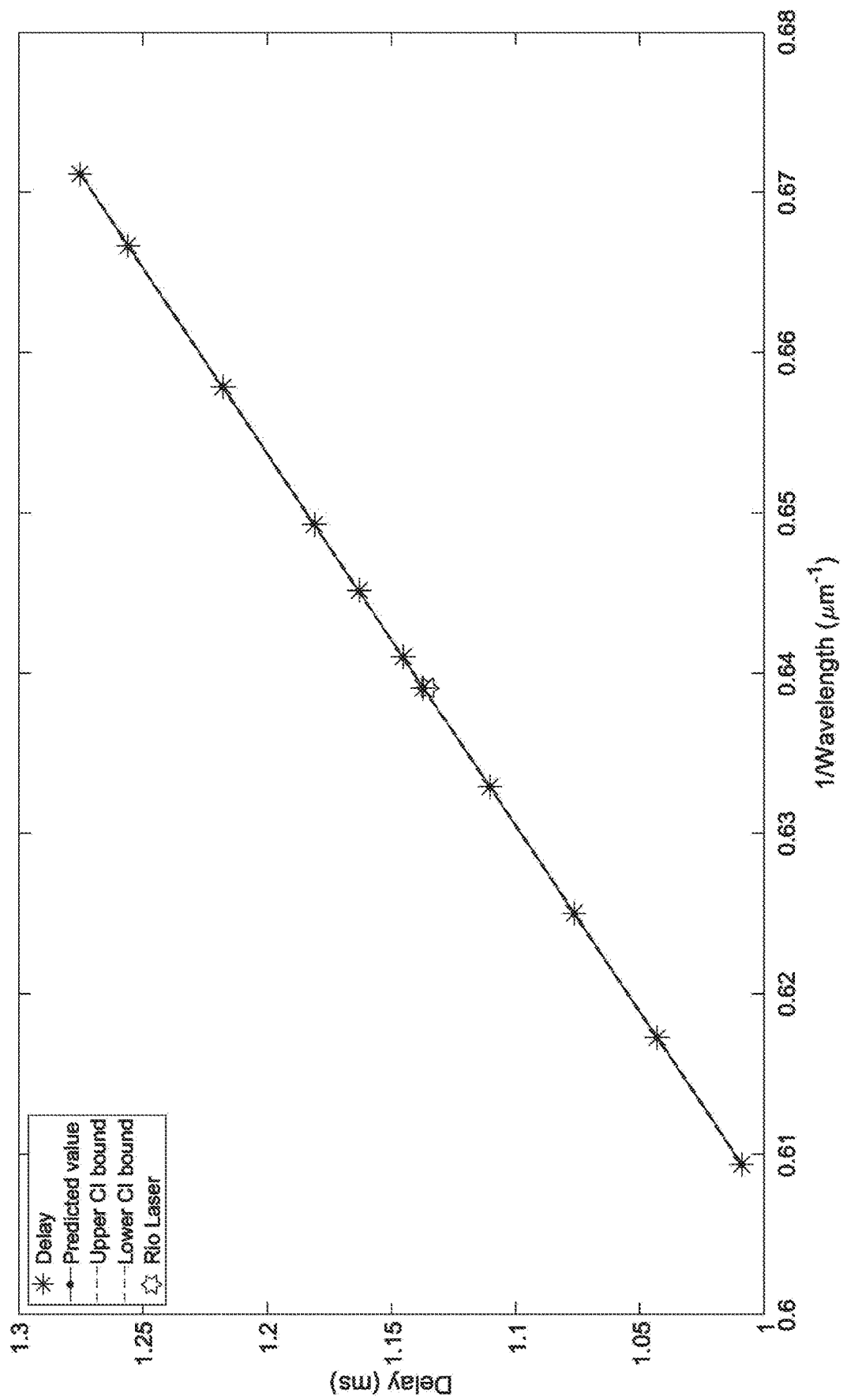
FIG. 3 shows a calibration curve of the optical instrument of FIG. 1.

The analyzer 24 may include a microprocessor and a memory unit is further electrically coupled to the optical detector device 22. The analyzer 24 may include a functional unit characterised as a calibration means which allows recording and storing the relationship as shown in FIG. 3.

Figure 6:
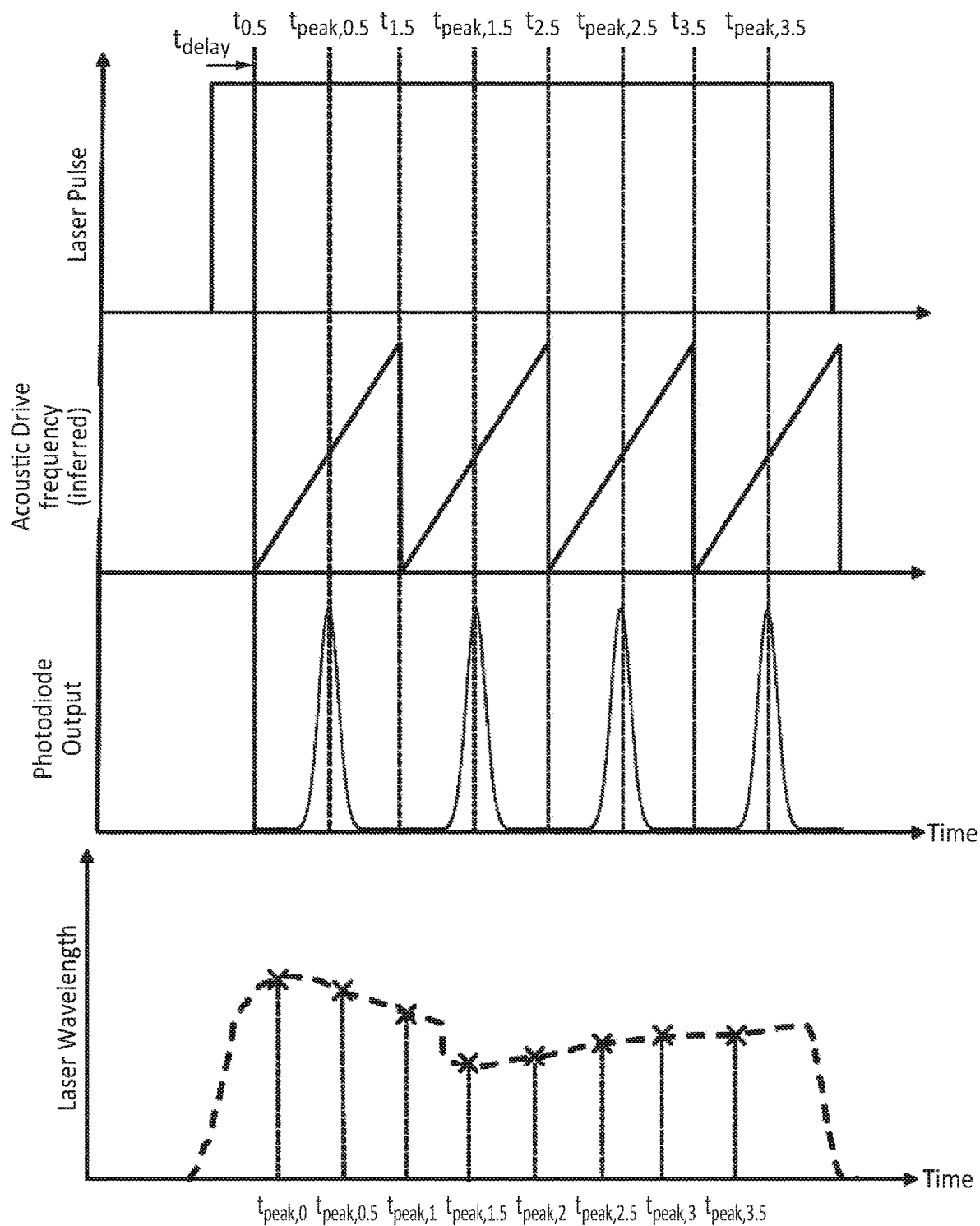
FIG. 6 shows time evolutions of a laser pulse, a parameter of the driving signal, and a measured intensity as observed when operating the optical instrument of FIG. 1 according to a third embodiment, and the corresponding measurements of wavelength over time.
Figure 7:
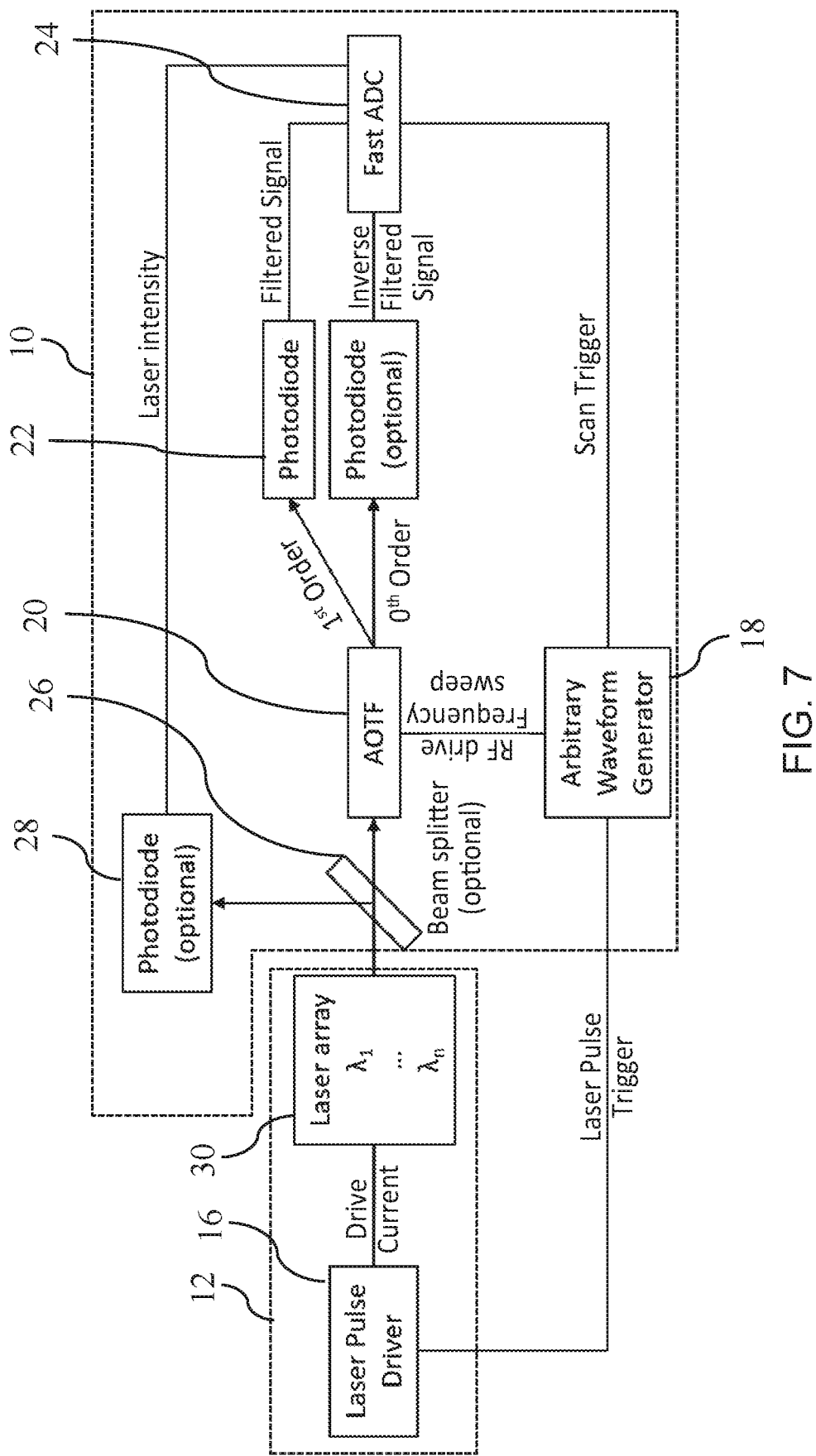
FIG. 7 is a is a block diagram of a light source and an optical instrument for determining a wavelength of the light source according to a further embodiment.

The embodiment of FIG. 7 includes the same features and characteristics as the embodiment of the optical instrument 10 of FIG. 1. The embodiment of FIG. 7 differs from the embodiment of FIG. 1 in that the light source 12 includes a laser array 30 instead of the laser 14. The laser array 30 is configured to provide light having multiple wavelengths. As the laser array 30 provides light of several wavelengths, the optical instrument 10 needs to be able to determine which wavelength is measured or, in other words, which laser of the laser array 30 corresponds to which filter function or parameter of the driving signal. The intensity peaks detected at the first photodiode of the light source 12 can be resolved using the method of FIG. 6, i.e. by varying the delay time. In other words, the time delay is a way of encoding which laser of the laser array 30 is being measured.

Figure 8:
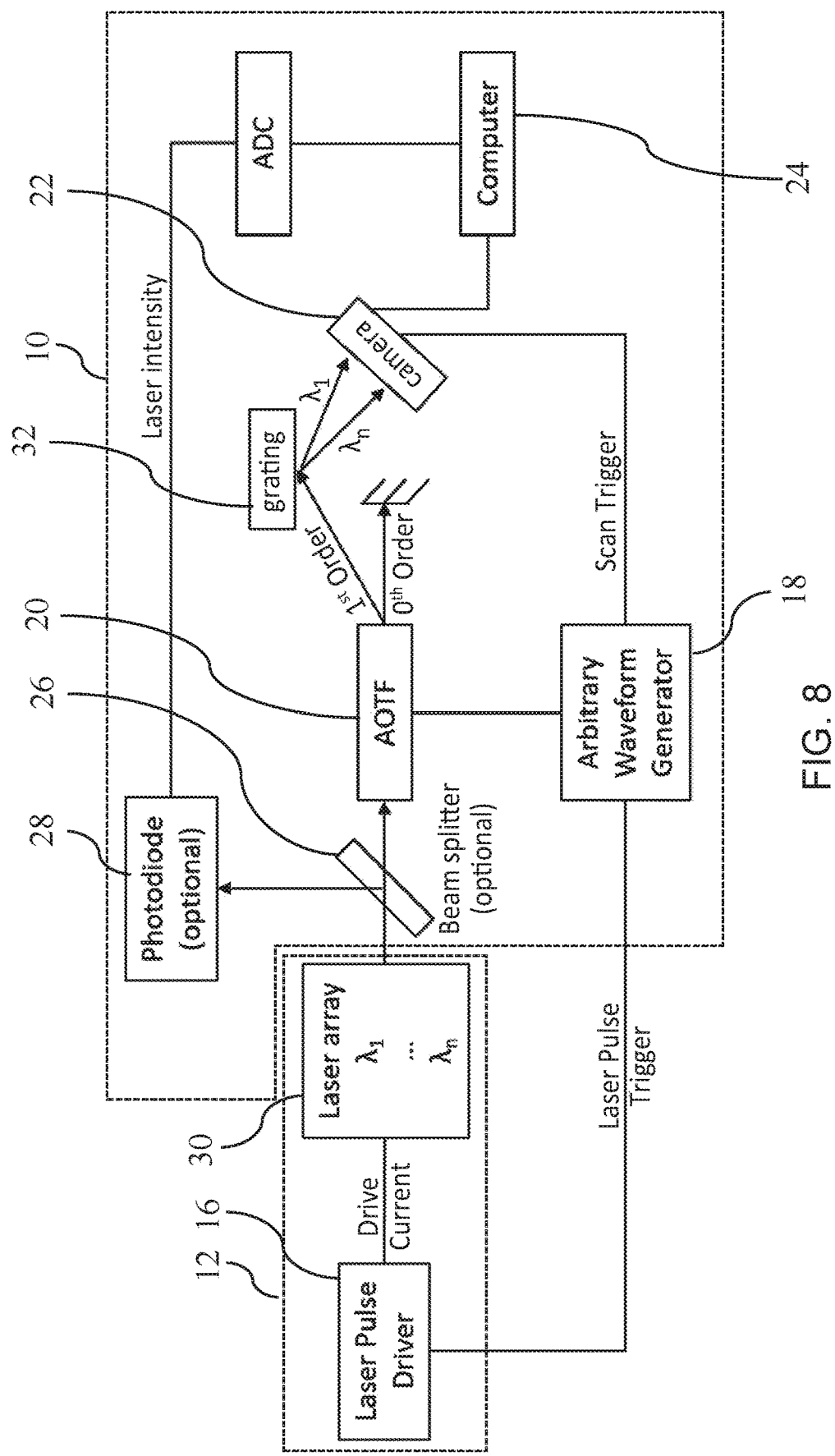
FIG. 8 is a is a block diagram of a light source and an optical instrument for determining a wavelength of the light source according to a further embodiment.

The embodiment of FIG. 8 includes the same features and characteristics as the embodiment of FIG. 7. The embodiment of FIG. 8 differs from the embodiment of FIG. 7 in that the optical instrument 10 includes a diffraction device 32 such as a grating. The diffraction device 32 is positioned between the tunable optical filter device 20 and the optical detector device 22. The diffraction device 32 is provided to spatially separate the light diffracted by the tunable optical filter depending on its wavelength. This allows to simultaneously measure the intensity of the diffracted light at several frequencies. In this case, the optical detector device 22 includes array of detectors (such as but not limited to a camera) to detect the response of each laser of the laser array 30 simultaneously.

Figure 9:
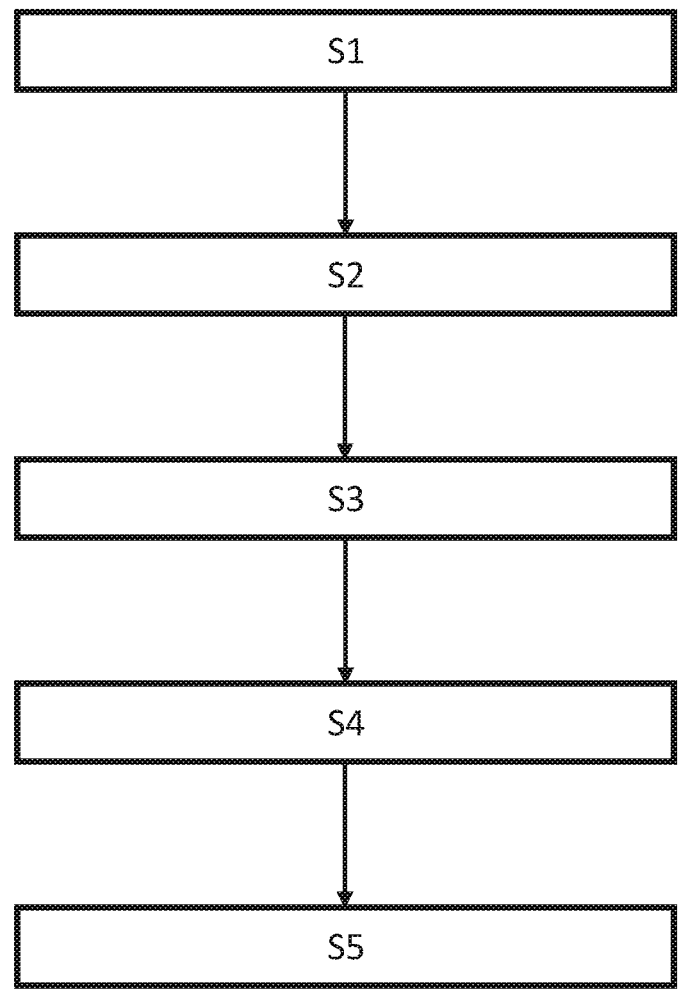
FIG. 9 is a block diagram showing steps of a method for measuring the wavelength of a light source.

A method for measuring the wavelength of the light source 12 is described with reference to FIG. 9. In step S1, the relationship between the wavelength and the time delay since the start of the driving signal parameter sweep is recorded. For this calibration step, various laser sources having known and fixed wavelengths can be used with the optical instrument 10 described above. Alternatively, a tunable laser source of known wavelength over time can be used with the optical instrument 10 described above. The time point of maximum intensity for the first-order diffraction is recorded for various known wavelength values. All the recorded time points are input into the relationship. In step S2, the light source 12 (as described above) or DUT is coupled to the optical instrument 10 and the driving signal parameter sweep is generated by the signal generator 18 (as described above). In step S3, the tunable optical filter device 20 diffracts the light generated by the light source 12 depending on the driving signal. In step S4, the optical detector device 22 measures the intensity of the modulated light and forwards the intensity measurement signal to the analyzer 24. In step S5, the analyzer 24 determines the point of time since the onset of the driving signal parameter sweep when the measured intensity is maximal. The analyzer 24 uses the stored relationship and the determined point of time to determine the wavelength of the light source 12.

Some embodiments of the invention and its optional embodiments can be summarized as follows:

The principle of operation of the optical instrument can be to utilize the rapid sweeping of the AOTF filter function (driving signal generated by the signal generator and fed to the tunable optical filter device) in time to rapidly measure the optical frequency of the light source or device-under-test (DUT) during a short period of time. The DUT or light source may be any type of optical device such as a laser, LED, etc. The DUT may be run in continuous or pulsed operation. Since the main advantage of some embodiments of this invention is for rapid detection of optical wavelength, the operation of this device in pulsed mode will be the focus of the description.

Light emitted from or transmitted through the DUT is optionally split using a beam splitter. This gives the option of measuring the amplitude/intensity using a fast photodiode while simultaneously measuring the optical frequency of the DUT. The main or first optical path will next pass through the tunable optical filter device or AOTF. Based on the optical frequency of light and acoustic frequency through the AOTF crystal or tunable optical filter device at a given instant, the light may either pass through the tunable optical filter device or AOTF undiffracted (0th order) or may be diffracted if the optical and acoustic frequencies match per the Bragg diffraction equation (1st order diffraction), or some combination of the two depending on the efficiency of the tunable optical filter device or AOTF. When the acoustic and optical frequency wave vectors match, the filter efficiency is at its greatest and as the acoustic frequency deviates from the optimum value, the tunable optical filter device or AOTF is less efficient. Therefore, by finding the optical peak of the 1st order diffraction intensity (or, alternatively, the trough of the 0th order diffraction) it is possible to determine the optical frequency if the acoustic frequency is known. Optionally, in this configuration, the 1st order diffraction is chosen to improve the Signal-to-Noise Ratio (SNR). This signal is collected using a photodiode and is measured using an analog-to-digital converter (ADC). The analog-to-digital converter, the photodiode for detecting first-order diffracted light, and the photodiode for detecting zeroth-order diffracted light may constitute an optical detector device. The optical detector device, in particular the analog-to-digital converter, may be connected or coupled to an analyzer or performs the functions of the analyzer. The signals input into the analog-to-digital converter can be considered inputs to the analyzer.

Given that the optical frequency can be determined by matching it to an acoustic frequency traveling through the tunable optical filter device or AOTF, it becomes possible to use rapid acoustic frequency sweeps to locate the point of maximum efficiency of the filter, which in turn corresponds to the optical frequency of the light source or DUT. The acoustic drive frequency for the tunable optical filter device or AOTF may be modulated in a linear ramp fashion (essentially a sinusoidal signal with monotonically increasing frequency) driven by a high-accuracy arbitrary waveform generator, allowing for rapid frequency sweeps at acoustic frequencies. As the acoustic frequency sweep approaches the point of maximum diffraction efficiency, the photodetector signal measuring the 1st order diffracted light will begin to rise until the optical and acoustic frequencies match the Bragg diffraction criterion and the momentum of the diffracted beam is matched by the sum of the momenta of the incident beam and the acoustic wave, resulting in the maximum of the 1st order beam. After this, the momenta of the incident and diffracted beam will not be perfectly matched by the momentum of the acoustic wave, so the optical and acoustic frequencies will diverge, and the signal will decrease.

Since the acoustic drive signal is quite rapid (typically 50-200 MHz), the acoustic drive signal may not be measured directly. However, since the parameters of the frequency sweep are well defined, it is possible to instead know the frequency at any time by knowing the difference in the current time and the time at which the sweep started (e.g., a simple linear relationship). By extension, it is possible to know the acoustic frequency at which the maximum of the tunable optical filter device or AOTF response occurs by the difference in time between when the peak occurs ($t_{peak}$) and the start of the sweep ($t_0$).

Given that the principle of operation of the tunable optical filter device or AOTF can result in a 1:1 relationship between the frequency of maximum efficiency of the filter and a given optical frequency, a calibration curve between the peak of the filter function and the optical frequency can be obtained. Thus, given the delay between the start of the acoustic drive frequency sweep and the maximum of the optical detector device or photodiode output from the first order of diffraction, and the sweep parameters, it is possible to get the instantaneous acoustic frequency of the maximum efficiency of the filter function. Given that parameter, the calibration curve provides the instantaneous optical frequency of the light source or DUT (within the uncertainty of the width of the filter function). This is the main principle of operation of this device.

A summary of the wavelength determination with regard to FIGS. 2 and 3 is as follows:
  Waveform generator triggers data acquisition of photodiode output (bottom plot of FIG. 2).
  $t_{peak}$–$t_0$ is calculated using curve fit
  Acoustic drive frequency is inferred from this delay as the waveform shape (and thereby instantaneous frequency) is known (middle plot in FIG. 2).
  Laser wavelength is inferred from calibration curve (FIG. 3) from acoustic drive frequency at peak and corresponding delay.

Below is the description of optional methods to improve the utility of this optical instrument.

The above methodology can be extended to measure multiple points in time by repeating the measurements as needed. An example of such measurement is described for a pulsed light source or DUT. In this measurement, the acoustic frequency ramp is swept multiple times, resulting in a time sampling of the response of the light source or DUT as shown in FIG. 4. For example, optical signal peaks can be obtained for various acoustic frequency sweep windows during one optical signal pulse, as shown in FIG. 5, top graph. The average delay of 100 optical signal peaks obtained for each acoustic frequency sweep window for 100 laser pulses is translated to an average wavelength value and its 95% confidence interval for each frequency sweep window, as shown in FIG. 5, middle graph. The deviation from the steady state optical frequency can be calculated and arbitrary tolerance markers can be defined, as shown in FIG. 5, bottom graph.

One limitation of the described approach is that the time resolution is determined by the length of the acoustic frequency sweep window. The sweep duration is limited by a number of factors, including the rise time of the tunable optical filter device or AOTF (typ. 4-10 microseconds), the sampling rate, and the spectral width of the tunable optical filter device or AOTF filter function. Thus, using it in the configuration described above, it is not possible to have arbitrarily fast sweeps. If the assumption is made (with a pulsed light source or DUT) that the pulses are highly correlated between each shot, it is possible to use a known delay to improve the time resolution of this method. For example, on the first pulse of the light source DUT the result might look like as described above and illustrated in FIG. 4. By delaying the onset of the acoustic frequency sweep a known amount, the filter responses will be shifted in time, thereby sampling a different segment in time of the pulsed tunable optical filter device or DUT frequency response. This can be repeated for a range of delays to measure the frequency response with high time resolution, as shown in FIG. 6.

This embodiment of the invention can be summarized as follows: to further improve time resolution of this measurement, an initial delay can be used. In essence, the only time the frequency of the laser is being measured is near the peak of the tunable optical filter device or AOTF filter function. By offsetting the start of the data collection by a known amount, the laser pulse is effectively being sampled at different points during the laser pulse for each offset chosen.

Thereby, by taking the measurement over multiple laser pulses it is possible to interleave the data from each pulse to create a higher time resolution representation of the instantaneous frequency response of the laser during the pulse.

Heretofore, the measurement of a single wavelength has been described, however this method can extend to the measurement of multiple wavelengths simultaneously as well. Due to the principle of linear independence of acoustic waves, it is possible to drive the tunable optical filter device or AOTF with acoustic signals which will simultaneously filter optical signals at disparate wavelengths. The advantage to this technique is two-fold, allowing for the detection of multiple wavelengths simultaneously or improving measurement throughput.

Using such a method, it is important to discriminate which laser of the light source corresponds to which filter function. This can be accomplished in two ways. The first embodiment is to use the timing of the sweeps to discriminate between wavelengths. Similar to the method described above to improve the throughput using discrete timing delays, the same idea can be used to discriminate between wavelengths; however, in this way by delaying the acoustic sweeps it is possible to separate the filter peaks and determine the instantaneous wavelength of each laser by time-encoding which laser is being measured. This is illustrated in FIG. 7.

An alternative embodiment utilizes a diffraction grating to separate each laser based on their operating wavelength, as illustrated in FIG. 8. By spatially separating the output of each laser, it becomes possible to use an array of detectors (such as but not limited to a camera) to detect the response of each laser simultaneously.

What is claimed is:

1. An optical instrument for determining a wavelength of light generated by a light source, comprising
   a signal generator for generating a driving signal,
   a tunable optical filter device configured to receive the driving signal, the tunable optical filter device configured to diffract the light generated by the light source based on the driving signal,
   an optical detector device configured to detect intensity as a degree of diffraction of the light diffracted by the tunable optical filter device, and
   an analyzer configured to determine the wavelength of the light based on the timing of the diffraction;
   wherein
      the signal generator is configured to generate a trigger signal;
      the signal generator generates a plurality of identical driving signals one after another for measuring the wavelengths of the light source at various points of time; and
      the signal generator generates a first driving signal of the plurality of driving signals after the generation of the trigger signal by a predetermined time lag.

2. The optical instrument of claim 1, wherein the tunable optical filter device includes an acousto-optic tunable filter (AOTF).

3. The optical instrument of claim 1, wherein the signal generator generates the driving signal which is a frequency-modulated wave whose frequency is swept from a minimum frequency to a maximum frequency.

4. The optical instrument of claim 3, wherein the signal generator is configured to generate a trigger signal simultaneous to the generation of the driving signal frequency sweep for indicating a start of the driving signal frequency sweep.

5. The optical instrument of claim 1, wherein the signal generator is configured to be coupled to the light source, the signal generator configured to supply a trigger signal to the light source for starting the generation of a light pulse.

6. The optical instrument of claim 5, wherein the signal generator is coupled to the analyzer for supplying the trigger signal to the analyzer.

7. The optical instrument of claim 5, wherein the analyzer includes a calibration means configured to store a relationship between the wavelength of a light and the time since the generation of the trigger signal.

8. The optical instrument of claim 1, wherein the optical detector device includes a first photodiode which is positioned to detect first-order diffracted light.

9. The optical instrument of claim 1, wherein the optical detector device includes a second photodiode which is positioned to detect zeroth-order diffracted light.

10. The optical instrument of claim 1, further comprising a beam splitter and an optical detector configured to measure an intensity of received light and to supply the measured intensity to the analyzer, wherein the beam splitter is configured to split incoming light between a first path directed to the tunable optical filter device and a second path directed to the optical detector.

11. The optical instrument of claim 1, wherein the signal generator generates a plurality of identical driving signals one after another for measuring the wavelength of the light at various points of time.

12. The optical instrument of claim 4, wherein the signal generator generates the driving signal after the generation of the trigger signal by a predetermined time lag for varying the point in time at which the wavelength of the light is determined.

13. The optical instrument of claim 1, further comprising a diffraction device configured to diffract light depending on its wavelength, wherein the diffraction device is positioned to diffract the light previously diffracted by the tunable optical filter device.

14. The optical instrument of claim 13, wherein the diffraction device is positioned to diffract the first-order diffracted light.

15. The optical instrument of claim 1, wherein the optical detector device is configured to detect the light diffracted by the tunable optical filter device at spatially separated locations.

16. An optical system, comprising
   the optical instrument of claim 1, and
   a light source generating light which is input into the tunable optical filter device.

17. The optical system of claim 16, wherein the light source includes a laser and/or a light emitting diode (LED), wherein the light source is configured to be run in continuous or pulsed operation.

18. The optical system of claim 17, wherein the light source includes a power driver configured to output a drive current to the laser and/or a light emitting diode (LED), the drive current controlling the output of the light.

19. A method for determining a wavelength of light generated by a light source:
   generating a trigger signal;
   generating a plurality of identical driving signals one after another for measuring the wavelengths of the light source at various points of time,
   generating a first driving signal of the plurality of driving signals after the generation of the trigger signal by a predetermined time lag,
   diffracting the light generated by the light source based on the first driving signal,
   detecting a time of maximum diffraction of the diffracted light with respect to the onset of a driving signal parameter sweep, and determining the wavelength of the light based on the maximum diffraction timing.

\* \* \* \* \*